United States Patent [19]

Futakuchi

[11] Patent Number: 4,562,404
[45] Date of Patent: Dec. 31, 1985

[54] FM DEMODULATOR WITH SELECTIVE PHASE SHIFT CIRCUITS

[75] Inventor: Tomoaki Futakuchi, Takaoka, Japan

[73] Assignee: Murata Manufacturing Co., Ltd., Nagaokakyo, Japan

[21] Appl. No.: 631,995

[22] Filed: Jul. 18, 1984

[30] Foreign Application Priority Data

Jul. 22, 1983 [JP] Japan .................. 58-134964

[51] Int. Cl.$^4$ .................................. H03D 3/06
[52] U.S. Cl. .................. 329/118; 329/137; 329/145; 358/23; 455/214
[58] Field of Search .............. 329/1, 2, 117, 118, 329/137, 145, 103; 455/144, 214, 335, 337; 358/23, 24

[56] References Cited

U.S. PATENT DOCUMENTS 4,160,955 7/1979 Sato ............................... 329/2
4,188,639 2/1980 Murakami et al. .......... 358/23 X

FOREIGN PATENT DOCUMENTS 2455379 6/1975 Fed. Rep. of Germany ...... 358/24

Primary Examiner—Siegfried H. Grimm
Attorney, Agent, or Firm—Wenderoth, Lind & Ponack

[57] ABSTRACT

The disclosure is directed to an improved FM demodulating circuit which is simple in circuit construction, with a small number of parts required, and so arranged that in a quadrature detecting circuit, a plurality of piezoelectric resonators, for example, ceramic discriminators employed for a phase shift circuit are changed over by switching circuits for common use of parts other than the ceramic discriminators for the demodulation of the FM intermediate frequency signals.

4 Claims, 6 Drawing Figures

FM DEMODULATOR WITH SELECTIVE PHASE SHIFT CIRCUITS

BACKGROUND OF THE INVENTION

The present invention generally relates to an FM demodulating circuit employing quadrature detecting system and more particularly, to an FM demodulating circuit for a television receiver, video tape recorder or the like, having functions for subjecting a plurality of intermediate frequency signals with different frequencies, to FM demodulation.

As shown in FIG. 1, a quadrature detecting circuit is generally so arranged that an FM intermediate frequency signal produced from a limiter amplifier 1 at the last stage of an FM intermediate frequency amplifier, and a signal obtained by subjecting this FM intermediate frequency signal to phase shifting through a phase shift circuit 2, are respectively applied to a multiplier 3 so as to detect a phase difference between these two signals by the multiplier 3, the output of which is passed through a low-pass filter 4 connected thereto to obtain the FM demodulated signal. The limiter amplifier 1, multiplier 3 and low-pass filter 4 as described above are normally formed into an FM demodulating integrated circuit (IC) 6 together with an amplifier 5 coupled to the low-pass filter 4 for amplifying the FM demodulated signal produced from said low-pass filter 4. Meanwhile, for the phase shift circuit 2, there is generally employed a piezoelectric resonator, for example, a ceramic discriminator, which is connected to the FM demodulating integrated circuit 6 as a discrete part.

Incidentally, television broadcasting includes the NTSC system, PAL system, SECAM system, etc., and signal frequencies of the voice intermediate frequency signals differ according to such television broadcasting systems. Therefore, in television receivers, video tape recorders, etc. which are capable of changing over, for example, between the NTSC system and the PAL system, or between the PAL system and the SECAM system, etc. by change-over switches, it has conventionally been so arranged that FM demodulating circuits each including the FM demodulating integrated circuit 6 and phase shift circuit 2 are provided to correspond to the respective systems as described above for the demodulation of the voice intermediate frequencies, while such FM demodulating circuits are adapted to be changed over by switching circuits associated with said change-over switches.

In the known FM demodulating circuit as described so far, there have been such disadvantages that the plurality of the FM demodulating integrated circuits 6 are required, thus resulting in a complicated circuit construction, with an increase in the number of parts employed.

SUMMARY OF THE INVENTION

Accordingly, an essential object of the present invention is to provide an improved FM demodulating circuit which is simple in circuit construction, with the small number of parts required, and so arranged that in a quadrature detecting circuit, the plurality of piezoelectric resonators, for example, ceramic discriminators employed for a phase shift circuit are changed over by switching circuits for common use of parts other than the ceramic discriminators, thereby to demodulate the FM intermediate frequency signals in question.

Another important object of the present invention is to provide an FM demodulating circuit of the above described type which is stable in functioning at high reliability, and can be readily incorporated into various electrical and electronic equipment at low cost.

In accomplishing these and other objects, according to one preferred embodiment of the present invention, there is provided an FM demodulating circuit arranged as follows.

In a quadrature detecting circuit which is so arranged that an FM intermediate frequency signal produced from an FM intermediate frequency amplifying circuit, and a signal obtained by subjecting the FM intermediate frequency signal to phase shifting through a phase shift circuit are respectively input to a multiplier so as to obtain an FM demodulating signal by a phase difference between these two signals, an FM demodulating circuit comprising DC blocking capacitors respectively inserted between said phase shift circuit and said FM intermediate frequency amplifying circuit, and between said phase shift circuit and said multiplier, said phase shift circuit including a plurality of piezoelectric resonators, for example, ceramic discriminators to be respectively tuned to different FM intermediate frequencies, and change-over circuits made of switching diodes and respectively connected between input and output sides of said ceramic discriminators and said DC blocking capacitors.

By the circuit arrangement as described above, an improved FM demodulating circuit has been advantageously presented, with a substantial elimination of disadvantages inherent in the conventional circuit arrangements of this kind.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
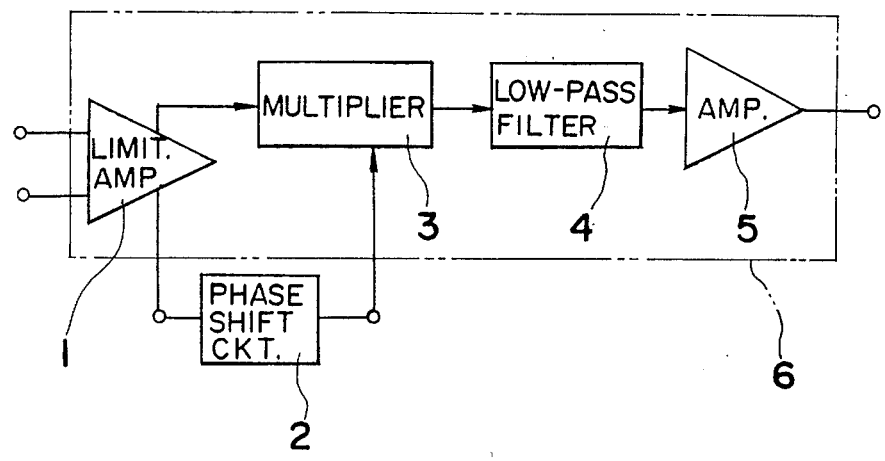
FIG. 1 is a block diagram explanatory of principle of a known quadrature detecting circuit (already referred to)

Before the description of the present invention proceeds, it is to be noted that like parts are designated by like reference numerals throughout the accompanying drawings.

Figure 2:
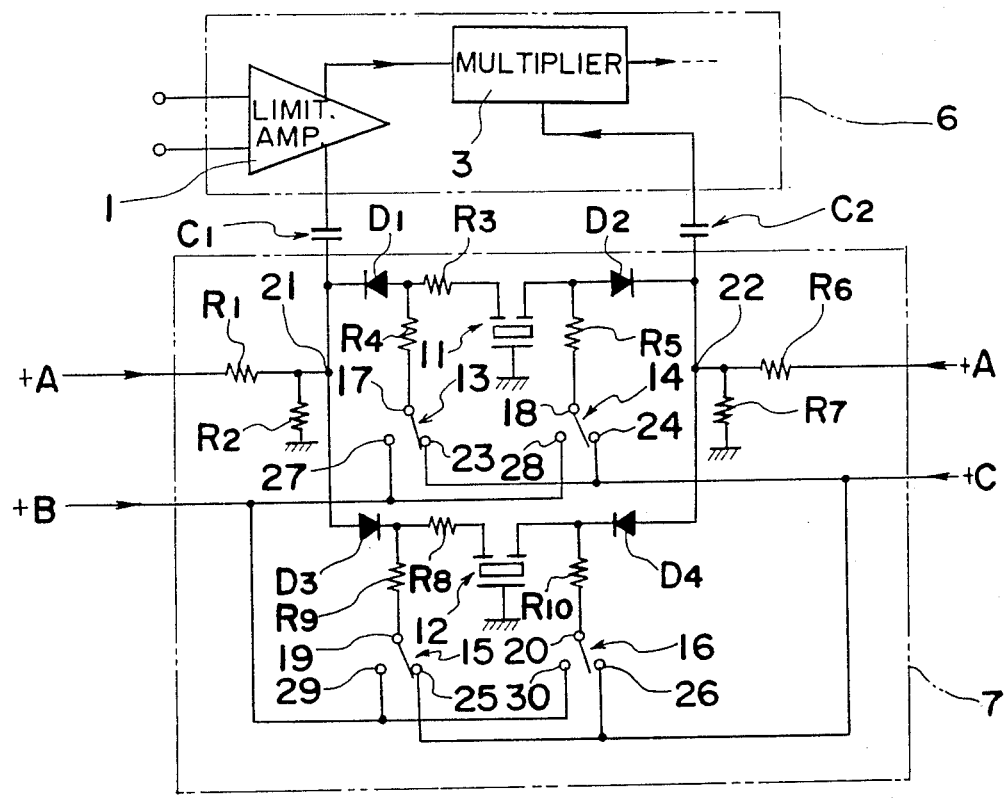
FIG. 2 is an electrical circuit diagram of an FM demodulating circuit according to one preferred embodiment of the present invention.

Referring now to the drawings, there is shown in FIG. 2 an FM demodulating circuit of a quadrature system for 5.5 MHz and 6.5 MHz according to one preferred embodiment of the present invention, which generally includes the integrated circuit 6 of the quadrature system for the FM demodulation having the construction similar to that in FIG. 1, a phase shift cirucit 7, and DC blocking capacitors C1 and C2 inserted between the circuits 6 and 7. The phase shift circuit 7 referred to above includes a piezoelectric resonator, for example, a ceramic discriminator 11 for 5.5 MHz, another ceramic discriminator 12 for 6.5 MHz, change-over switches 13, 14, 15 and 16, switching diodes D1, D2, D3 and D4, and resistors R1, R2, R3, R4, R5, R6, R7, R8, R9 and R10 which are connected to each other in a manner as described hereinbelow.

Between the anode of the switching diode D1 and the input electrode of the ceramic discriminator 11, and also, between the anode of the diode D1 and a movable contact 17 of the change-over switch 13, there are respectively connected the resistors R3 and R4, while the anode of the switching diode D2 is directly connected to the output electrode of said ceramic discriminator 11, with the resistor R5 being inserted between said output electrode of the ceramic discriminator 11 and a movable contact 18 of the change-over switch 14. On the other hand, between the cathode of the switching diode D3 and the input electrode of the ceramic discriminator 12 and also between said cathode and a movable contact 19 of the change-over switch 15, the resistors R8 and R9 are respectively connected, while the cathode of the switching diode D4 is directly connected to the output electrode of the ceramic discriminator 12, with the resistor R10 being inserted between said output electrode and a movable contact 20 of the change-over switch 16. The ground or earth electrodes of said ceramic discriminators 11 and 12 are respectively grounded.

The cathode of the switching diode D1 and the anode of the switching diode D3 are connected to each other, while a junction 21 therebetween is coupled to a DC power source $(+A)$ through the resistor R1 and also to the ground through the resistor R2, with the DC blocking capacitor C1 being connected between said junction 21 and the limiter amplifier 1 of the FM demodulating integrated circuit 6.

Similarly, the cathode of the switching diode D2 and the anode of the switching diode D4 are connected to each other, while a junction 22 therebetween is coupled to the DC power source $(+A)$ through the resistor R6 and also to the ground through the resistor R7, with the DC blocking capacitor C2 being connected between said junction 22 and the multiplier 3 of the FM demodulating integrated circuit 6.

Stationary contacts 23, 24, 25 and 26 for selection of 5.5 MHz (referred to as 5.5 MHz contacts hereinafter) of the change-over switches 13, 14, 15 and 16 are each connected to a DC power source $(+C)$, while stationary contacts 27, 28, 29 and 30 for selection of 6.5 MHz (referred to as 6.5 MHz contacts hereinafter) of the change-over switches 13, 14, 15 and 16 are respectively connected to a DC power source $(+B)$.

The DC power sources $(+A)$, $(+B)$ and $(+C)$ referred to above are so set, in voltages thereof, as to satisfy the relation $(+C)>>(+A)>>(+B)$.

In the FM demodulating circuit of FIG. 2, when the movable contacts 17, 18, 19 and 20 of the change-over switches 13, 14, 15 and 16 are respectively connected to the 5.5 MHz contacts 23, 24, 25 and 26, voltage in the forward direction is applied to the switching diodes D1 and D2, while voltage in the reverse direction is impressed to the switching diodes D3 and D4 respectively, based on the relation $(+C)>>(+A)$, and thus, both the diodes D1 and D2 are turned on, with each of the diodes D3 and D4 turned off.

Accordingly, the FM intermediate frequency signal at 5.5 MHz applied to the junction 21 from the limiter amplifier 1 of the FM demodulating integrated circuit 6 through the DC blocking capacitor C1 is input to the ceramic discriminator 11 via the switching diode D1 and resistor R3 since the switching diode D3 is turned off, and after having been subjected to phase shift at said ceramic discriminator 11, is applied to the multiplier 3 through the switching diode D2 and the DC blocking capacitor C2, and thus, the demodulated signal of the FM intermediate frequency signal at 5.5 MHz may be obtained from the FM demodulating integrated circuit 6.

On the other hand, when the movable contacts 17, 18, 19 and 20 of the change-over switches 13, 14, 15 and 16 are respectively connected to the 6.5 MHz contacts 27, 28, 29 and 30, voltage in the reverse direction is applied to the switching diodes D1 and D2, while voltage in the forward direction is impressed to the switching diodes D3 and D4 respectively, based on the relation $(+A)>>(+B)$, and thus, both the diodes D1 and D2 are turned off, with each of the diodes D3 and D4 turned on.

Accordingly, the FM intermediate frequency signal at 6.5 MHz applied to the junction 21 from the limiter amplifier 1 of the FM demodulating integrated circuit 6 through the DC blocking capacitor C1 is input to the side of the ceramic discriminator 12, and after having been subjected to phase shift in exactly the same manner as before, is applied to the multiplier 3 of the FM demodulating integrated circuit 6, and thus, the demodulated signal of the FM intermediate frequency signal at 6.5 MHz is available from the FM demodulating integrated circuit 6.

In the manner described so far, through employment of one FM demodulating integrated circuit 6 and two ceramic discriminators 11 and 12, it is possible to obtain the FM demodulating circuit, for example, for 5.5 MHz and 6.5 MHz.

Figure 3:
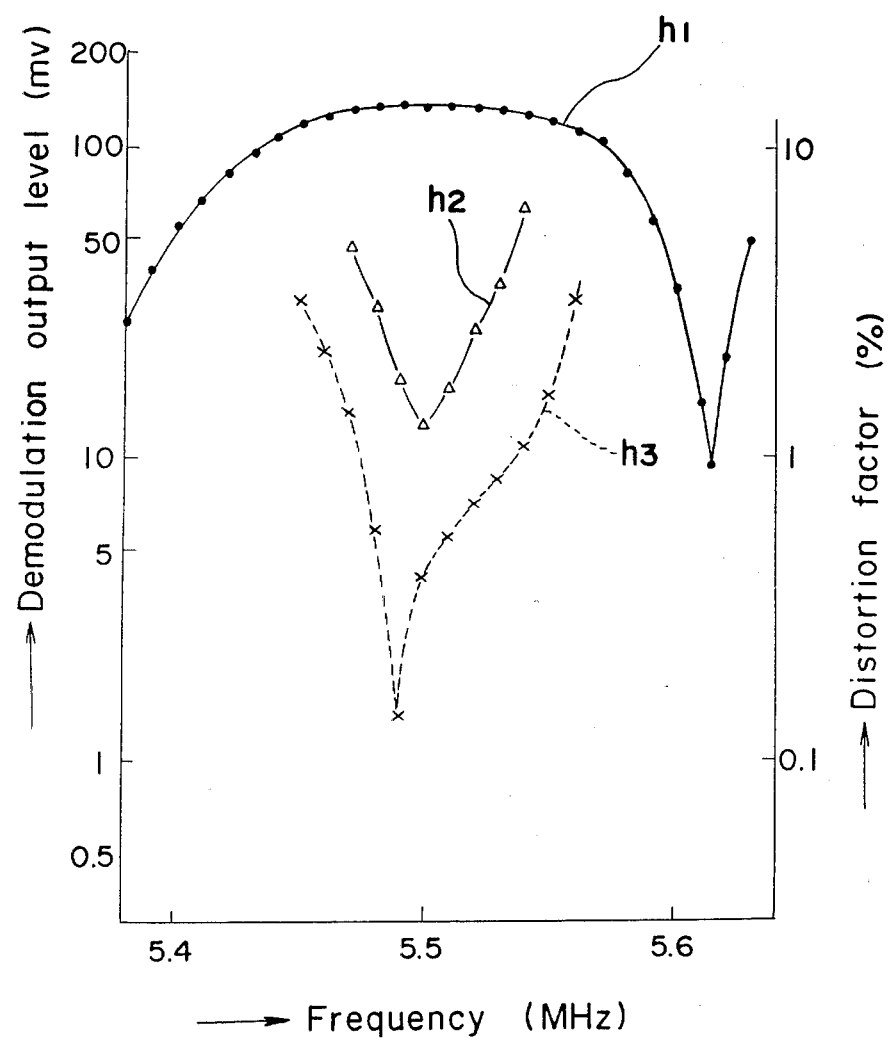
FIG. 3 is a frequency characteristic diagram for the FM demodulating circuit of FIG. 2 with respect to an FM intermediate frequency of 5.5 MHz.
Figure 4:
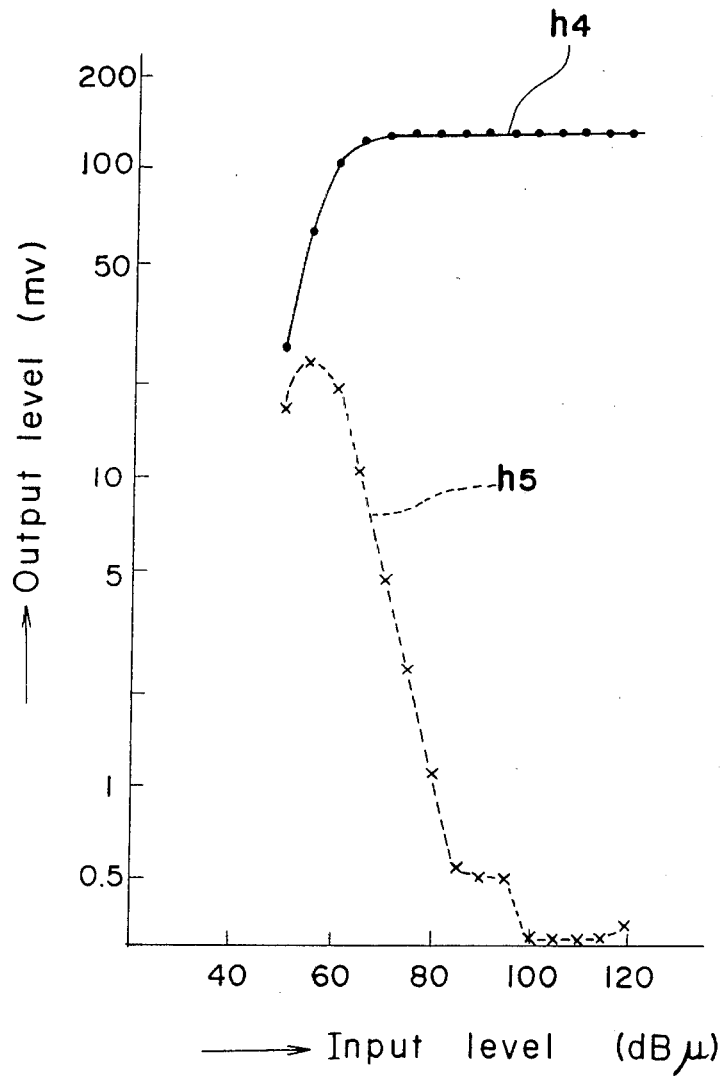
FIG. 4 is an input level characteristic diagram for the FM demodulating circuit of FIG. 2 with respect to the FM intermediate frequency of 5.5 MHz.

Subsequently, with respect to the FM demodulating circuit which employs two ceramic discriminators 11 and 12 for 5.5 MHz and 6.5 MHz and an integrated circuit μPC1391H (name used in trade and manufactured by Nippon Electric Company, Limited, Japan) as the FM demodulating integrated circuit 6, frequency characteristics and input level characteristics in the case where the movable contacts 17, 18, 19 and 20 of the change-over switches 13, 14, 15 and 16 are respectively connected to the 5.5 MHz contacts 23, 24, 25 and 26, are shown in FIGS. 3 and 4, while frequency characteristics and input level characteristics when said movable contacts 17, 18, 19 and 20 are respectively connected to the 6.5 MHz contacts 27, 28, 29 and 30, are given in the diagrams of FIGS. 5 and 6.

Figure 5:
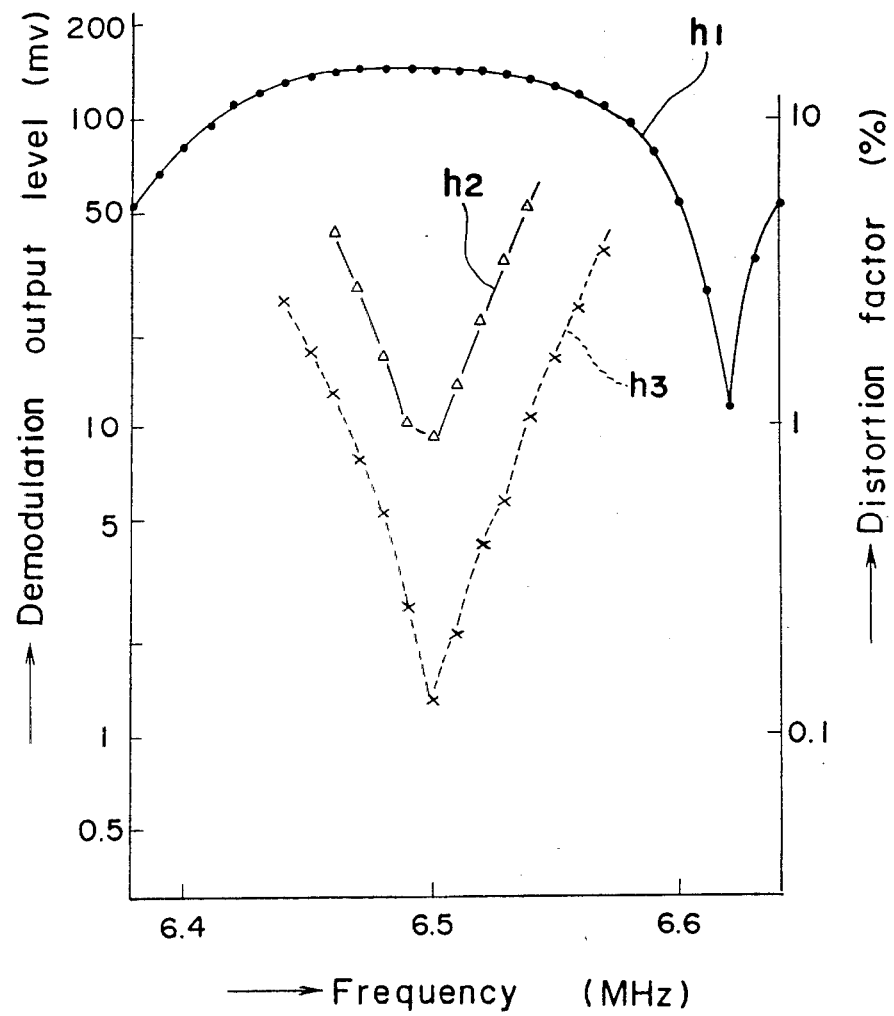
FIG. 5 is a frequency characteristic diagram for the FM demodulating circuit of FIG. 2 with respect to an FM intermediate frequency of 6.5 MHz.

In the frequency characteristics diagrams of FIGS. 3 and 5, curves h1 and h2 respectively show demodulation output level characteristics with respect to frequency and distortion factor characteristics with respect to frequency in the case where the FM intermediate frequency signal is subjected to frequency deviation by ±15 KHz by a signal of input level 100 dBμ at 400 Hz, while curves h3 represent distortion factor characteristics with respect to frequency when the above frequency deviation is set at ±50 KHz.

Figure 6:
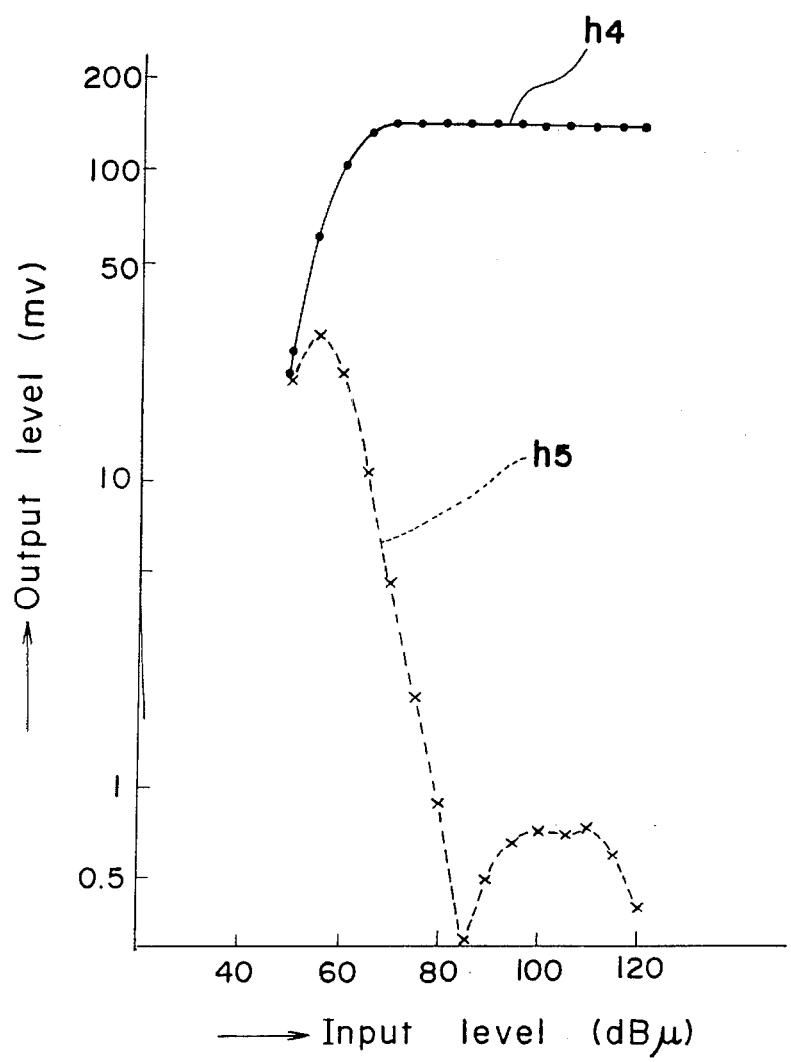
FIG. 6 is an input level characteristic diagram for the FM demodulating circuit of FIG. 2 with respect to the FM intermediate frequency of 6.5 MHz.

Meanwhile, in the frequency characteristics diagrams of FIGS. 4 and 6, curves h4 show output level characteristics with respect to the input level in the case where frequency modulation of ±15 KHz is applied to the FM intermediate frequency signals at 5.5 MHz and 6.5 MHz by the signal of 400 Hz, while curves h5 represent output level characteristics with respect to the input level in the case where amplitude modulation at a modulation percentage of 30% is applied to the FM intermediate frequency signals at 5.5 MHz and 6.5 MHz by the signal of 400 Hz.

As is understood from FIGS. 3 and 5, and FIGS. 4 and 6, generally the same results may be obtained both in the case where the FM intermediate frequency signal of 5.5 MHz is demodulated by the FM demodulating circuit of FIG. 2, and in the case where the FM intermediate frequency signal of 6.5 MHz is demodulated by said FM demodulating circuit.

It should be noted here that the change-over switches 13, 14, 15 and 16 described as employed in the foregoing embodiment may be replaced by semi-conductor elements arranged to apply different voltages to the respective switching diodes D1, D2, D3 and D4.

In the FM demodulating circuit in FIG. 2 as described so far, the DC blocking capacitors C1 and C2 are provided both at the input and output sides of the phase shift circuit 7, while the switching diodes D1, D2, D3 and D4 are further disposed both at the input and output sides of the ceramic discriminators 11 and 12, and therefore, matching balance of the ceramic discriminators 11 and 12 may be taken for reduction of interference between the ceramic discriminators, and thus, the FM demodulating circuit of the present invention has been put into actual application.

As is clear from the foregoing description, according to the present invention, since it is so arranged that the desired FM intermediate frequency signal is demodulated by changing over the plurality of piezoelectric resonators, for example, ceramic discriminators through the change-over circuit in the quadrature detecting circuit, parts other than the ceramic discriminators used as the phase shift circuit may be commonly utilized, and therefore, the circuit construction can be simplified, with a consequent reduction in the number of parts involved.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. In a quadrature detecting circuit which is so arranged that an FM intermediate frequency signal produced from an FM intermediate frequency amplifying circuit, and a signal obtained by subjecting the FM intermediate frequency signal to phase shifting through a phase shift circuit are respectively input to a multiplier so as to obtain an FM demodulating signal by a phase difference between these two signals, an FM demodulating circuit comprising DC blocking capacitors respectively inserted between said phase shift circuit and said FM intermediate frequency amplifying circuit, and between said phase shift circuit and said multiplier, said phase shift circuit including a plurality of piezoelectric resonators to be respectively tuned to different FM intermediate frequencies, and change-over circuits made of switching diodes and respectively connected between input and output sides of said piezoelectric resonators and said DC blocking capacitors.

2. An FM demodulating circuit as claimed in claim 1, wherein the plurality of piezoelectric resonators are a first piezoelectric resonator for 5.5 MHz and a second piezoelectric resonator for 6.5 MHz.

3. An FM demodulating circuit as claimed in claim 1, wherein said phase shift circuit further includes change-over switches associated with said switching diodes for the change-over circuits.

4. An FM demodulating circuit as claimed in claim 1, wherein said phase shift circuit further includes semiconductor elements arranged to apply different voltages to said respective switching diodes for the change-over circuits.

* * * * *